(12) United States Patent
Baker et al.

(10) Patent No.: US 10,302,510 B2
(45) Date of Patent: May 28, 2019

(54) WIRELESS AXIAL LOAD CELL AND SENSOR ASSEMBLY

(71) Applicant: TECAT Performance Systems, LLC, Ann Arbor, MI (US)

(72) Inventors: Douglas M. Baker, Ypsilanti, MI (US); Wen-Lung Huang, Ann Arbor, MI (US); Joseph D. Glandorf, Ann Arbor, MI (US); Ronald G. Rath, Fenton, MI (US)

(73) Assignee: TECAT PERFORMANCE SYSTEMS, LLC, Ann Arbor, MI (US)

( * ) Notice: Subject to any disclaimer, the term of this patent is extended or adjusted under 35 U.S.C. 154(b) by 0 days.

(21) Appl. No.: 15/883,772

(22) Filed: Jan. 30, 2018

(65) Prior Publication Data
US 2018/0217015 A1 Aug. 2, 2018

Related U.S. Application Data

(60) Provisional application No. 62/451,949, filed on Jan. 30, 2017.

(51) Int. Cl.
*G01L 5/00* (2006.01)
*G01L 1/22* (2006.01)
(Continued)

(52) U.S. Cl.
CPC ............ *G01L 1/2206* (2013.01); *F04B 47/02* (2013.01); *F04B 49/02* (2013.01); *F04B 49/065* (2013.01);
(Continued)

(58) Field of Classification Search
CPC ..... G01L 5/0033; G01L 5/0038; G01L 5/0061; G01L 5/102; H04L 67/12; H05K 7/1428; F04B 2201/0203
(Continued)

(56) References Cited

U.S. PATENT DOCUMENTS 6,446,123 B1 * 9/2002 Ballantine ............... H04L 41/06
709/223
8,024,980 B2 9/2011 Arms et al.
(Continued)

FOREIGN PATENT DOCUMENTS

WO 2010114916 A1 10/2010
WO 2014063485 A1 5/2014
(Continued)

*Primary Examiner* — Max H Noori
(74) *Attorney, Agent, or Firm* — John S. Artz; Dickinson Wright PLLC

(57) ABSTRACT

An integrated wireless data system including a wireless load cell assembly and method for measuring operational data of one or more components for safety, health monitoring, and control is provided. The wireless load cell assembly can include an energy storage device and may be configured to allow for bi-directional communication with a base unit to store operational parameters in a database for use in development of predictive maintenance techniques. The axial load cell can rotate freely for simple installation without regard to rotational orientation. A power management strategy and energy harvesting system are provided to ensure long term use of the wireless load cell assembly without the need to replace the energy storage device.

20 Claims, 10 Drawing Sheets

(51) Int. Cl.
*F04B 49/06* (2006.01)
*H04L 29/08* (2006.01)
*G01L 5/10* (2006.01)
*H05K 7/14* (2006.01)
*F04B 47/02* (2006.01)
*F04B 49/02* (2006.01)
*F04B 51/00* (2006.01)

(52) U.S. Cl.
CPC ............ *F04B 51/00* (2013.01); *G01L 1/2218* (2013.01); *G01L 5/0004* (2013.01); *G01L 5/0033* (2013.01); *G01L 5/0038* (2013.01); *G01L 5/0061* (2013.01); *G01L 5/102* (2013.01); *H04L 67/12* (2013.01); *H05K 7/1428* (2013.01); *F04B 2201/0203* (2013.01)

(58) Field of Classification Search
USPC .......................................................... 73/773
See application file for complete search history.

(56) References Cited

U.S. PATENT DOCUMENTS

| | | | | |
|---|---|---|---|---|
| 2004/0144529 | A1* | 7/2004 | Barnes .................... | F04B 47/02 |
| | | | | 166/53 |
| 2018/0008168 | A1* | 1/2018 | Pearlman ............. | A61B 5/6891 |
| 2018/0100293 | A1* | 4/2018 | Bewley ................ | E02F 9/2816 |

FOREIGN PATENT DOCUMENTS

| | | | |
|---|---|---|---|
| WO | 2015170267 | A1 | 11/2015 |
| WO | 2016078595 | A1 | 5/2016 |

\* cited by examiner

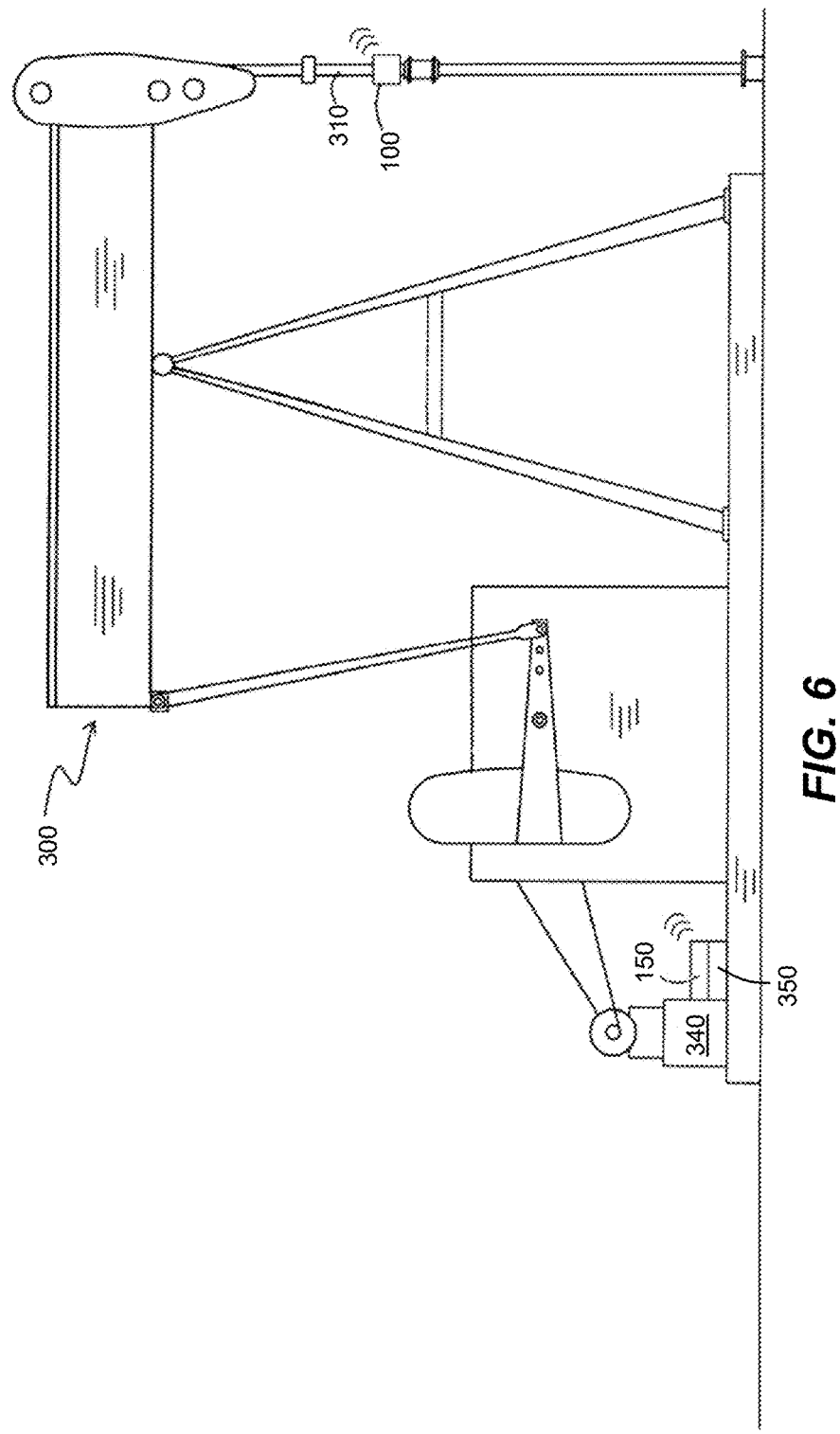

WIRELESS AXIAL LOAD CELL AND SENSOR ASSEMBLY

CROSS REFERENCE TO RELATED APPLICATION

This U.S. Utility Application claims the benefit of U.S. Provisional Application Ser. No. 62/451,949 filed Jan. 30, 2017 entitled "WIRELESS AXIAL LOAD CELL AND SENSOR ASSEMBLY", which is incorporated herein by reference in its entirety.

FIELD OF DISCLOSURE

The present disclosure generally relates to both static and dynamic load sensing. In particular, it relates to a wireless system and method for measuring axial loads. The system and method provide an integrated wireless data system with a wireless load cell assembly in communication with a base station for the purpose of monitoring, controlling, and recording measured loads and other characteristics, including, but not limited to, velocity, acceleration, position and temperature.

BACKGROUND OF THE DISCLOSURE

This section provides background information related to the present disclosure which is not necessarily prior art.

Load monitoring is performed in a variety of industries and applications as a method of predicting maintenance needs, for controlling motors, and for precise load measurements. Strain gage load cells are commonly used for these load measurements as they provide accurate data over a wide range of loads. Challenges arise with the use of these load cells due to the need to connect wires to the load cell in order to both power the strain gauges and to send the data back to a data acquisition system. In many applications, wires are difficult and time consuming to install, and, particularly in dynamic systems and in applications located in harsh environments, the wires are prone to breaking. For this reason, and due to the improvements to wireless communications over the past several years, wireless load cells have emerged.

Existing wireless load cell assemblies, however, have other drawbacks when incorporating them in to certain applications. Most require installation at a specific orientation, so as to ensure communications with a base system. In order to maintain this rotational positioning throughout the life of the system, these load cell assemblies incorporate an anti-rotation coupler, which requires a housing, poses installation challenges to achieve proper orientation, allows for uneven wear of the load cell spool, and increases load cell manufacturing complexity. In addition, existing wireless load cells have a relatively high current draw of greater than 6 mA at 60 Hz. These devices must be powered from a power storage device, such as a battery, that is sufficiently small in size to be packaged with the load cell. The high current draw combined with a small power storage device requires that the storage device be replaced frequently, every 3 months for example, which may be impractical for applications that are difficult to physically access. In addition, these systems have mono-directional communication systems, meaning that data can be transmitted from the load cell assembly to a base unit, but the load cell cannot receive information back from a base unit. Furthermore, existing wireless load cells are limited to measuring load only, and do not have the capability of measuring additional system data such as velocity, acceleration, position and temperature.

One example application of a use of a wireless load cell is on a pumpjack system used in the oil industry. Pumpjacks are dynamic systems used to pump fluid out of a well. Typically, these systems may have separate assemblies and controllers to measure and control characteristics of pumpjack equipment including measuring the speed at which the system is pumping, turning the pump on or off based on the weight of the fluid in the production tubing, or a combination of characteristics, such as measuring the weight of the fluid in the production tubing and the location of the polished rod relative to ground level. Measuring and controlling these characteristics are important for efficiency, health monitoring, and safety of the pumpjack. If the characteristics are not monitored properly, damage can be caused to parts of the pumpjack. For instance, the pumpjack can be damaged if its tube is only partially filled.

In measuring these characteristics, it is sometimes desirable to obtain high frequency data for improved diagnostics, in the event an anomaly occurs. For example, if there is a sudden change in load, it can be helpful to record the surrounding data at a high frequency, to aid in pinpointing the cause of the spike, and to determine whether or not it is a potential issue. Furthermore, it is desirable to monitor multiple characteristics of a pumpjack system for a predictive maintenance procedure for the system.

Some pumpjack systems currently use either wired or wireless load cell assemblies installed on a polished rod of the pumpjack system to measure the load on the rod. These load cell assemblies are continuously exposed to the elements and are often located in remote areas. The wired load cell assemblies are costly and time intensive to install, and have large maintenance costs due to the need to repair broken wires. In the past, however, wireless load cell assemblies have been cost prohibitive and unreliable due to RF drop outs during communications. Both wired and wireless load cell assemblies have only provided load data at a set frequency, and have not been capable of providing a full set of pumpjack operating characteristics, such as velocity and position, that are needed for optimal control and diagnostics.

Thus, there is a need for improved wireless load cell assemblies that do not require rotational positioning, that can last for several years without the need to change batteries, and that are capable of bi-directional communications.

SUMMARY OF THE DISCLOSURE

This section provides a general summary of the present disclosure and is not intended to be interpreted as a comprehensive disclosure of its full scope or all of its features, aspects and objectives.

The present disclosure includes an integrated wireless data system with a wireless load cell assembly and method for measuring operational characteristics for safety, health monitoring and control, including embedded prognostics, energy harvesting, high speed data and onboard statistics logging. Measured operational characteristics or data include, but are not limited to, load, velocity, acceleration, temperature, position, and the like.

According to one aspect of the present disclosure, an integrated wireless data system for measuring operational data of at least one component of a monitored system for at least one of safety and health monitoring and control is provided. The integrated wireless data system includes a wireless load cell assembly including a housing disposed about and containing a load cell and a plurality of strain gages and at least one additional sensor for measuring the operational data of the at least one component of the monitored system with an associated plurality of measurement parameters. The wireless load cell assembly has an electronics system including a cell analog to digital converter and a cell transceiver for wireless communication. The wireless load cell assembly also includes at least one cell antenna electrically coupled to the cell transceiver. The electronics system includes a cell microprocessor electrically coupled to the cell analog to digital converter and the cell transceiver and the plurality of strain gages and the at least one additional sensor and is configured to process and output the operational data and a control signal for controlling the monitored system using the cell transceiver and the at least one cell antenna. A base unit is disposed remotely from and in communication with the wireless load cell assembly for receiving and analyzing the operational data and sending a response signal back to the wireless load cell assembly to change the associated plurality of measurement parameters of the wireless load cell assembly based on the operational data received.

According to another aspect of the present disclosure, a method of operating an integrated wireless data system for measuring operational data of at least one component of a monitored system for safety, health monitoring, and control is also provided. The method includes the step of measuring operational data of the at least one component of the monitored system with an associated plurality of measurement parameters using a wireless load cell assembly of the integrated wireless data system. The method continues with the step of converting the operational data to a digital signal using the wireless load cell assembly. The next step of the method is transmitting the digital signal representing the operational data to a base unit using the wireless load cell assembly. Next, storing the operational data using the base unit. The method also includes the step of comparing the operational data to historical data for analysis using the base unit. The method proceeds with the step of sending a response signal back to the wireless load cell assembly using the base unit to change an associated plurality of measurement parameters of the wireless load cell assembly.

The aspects of the present disclosure present various advantages over current systems. For instance, the integrated wireless data system that is a transceiver-based system allows for bi-directional communications and control of measured components. In addition, the system and method allow for multiple sensors, such as a velocimeter, accelerometer, gyroscope and temperature sensor, to be mounted to the electronics circuit, which is packaged in the same housing as the load cell. Further, the electronics circuit contains an on-board microprocessor, enabling transmission of a control signal that has been processed based on all sensor inputs. This further reduces power consumption due to a reduction in the amount of data that needs to be transmitted. The system and method allow for the transmission of the operational data to the base station, which can receive and store the operational data, and transmit new operating parameters and new firmware to the remote system or wireless load cell assembly, without requiring access to the wireless load cell assembly. Additionally, the housing of the wireless load cell assembly eliminates the need for an anti-rotation coupler.

BRIEF DESCRIPTION OF THE DRAWINGS

The drawings described herein are for illustrative purposes only of selected embodiments and not all implementations, and are not intended to limit the present disclosure to only that actually shown. With this in mind, various features and advantages of example embodiments of the present disclosure will become apparent from the following written description when considered in combination with the appended drawings, in which:

FIG. 6 is an illustration of an example application wherein the wireless load cell assembly is disposed on a pumpjack system according to aspects of the disclosure.

DETAILED DESCRIPTION OF THE PRESENT DISCLOSURE

Detailed aspects of the present disclosure are provided herein; however, it is to be understood that the disclosed aspects are merely exemplary and may be embodied in various and alternative forms. It is not intended that these aspects illustrate and describe all possible forms of the disclosure. Rather, the words used in the specification are words of description rather than limitation, and it is understood that various changes may be made without departing from the spirit and scope of the disclosure. As those of ordinary skill in the art will understand, various features of the present disclosure as illustrated and described with reference to any of the Figures may be combined with features illustrated in one or more other Figures to produce examples of the present disclosure that are not explicitly illustrated or described. The combinations of features illustrated provide representative examples for typical applications. However, various combinations and modifications of the features consistent with the teachings of the present disclosure may be desired for particular applications or implementations. Additionally, the features and various implementing embodiments may be combined to form further examples of the disclosure.

Figure 1:
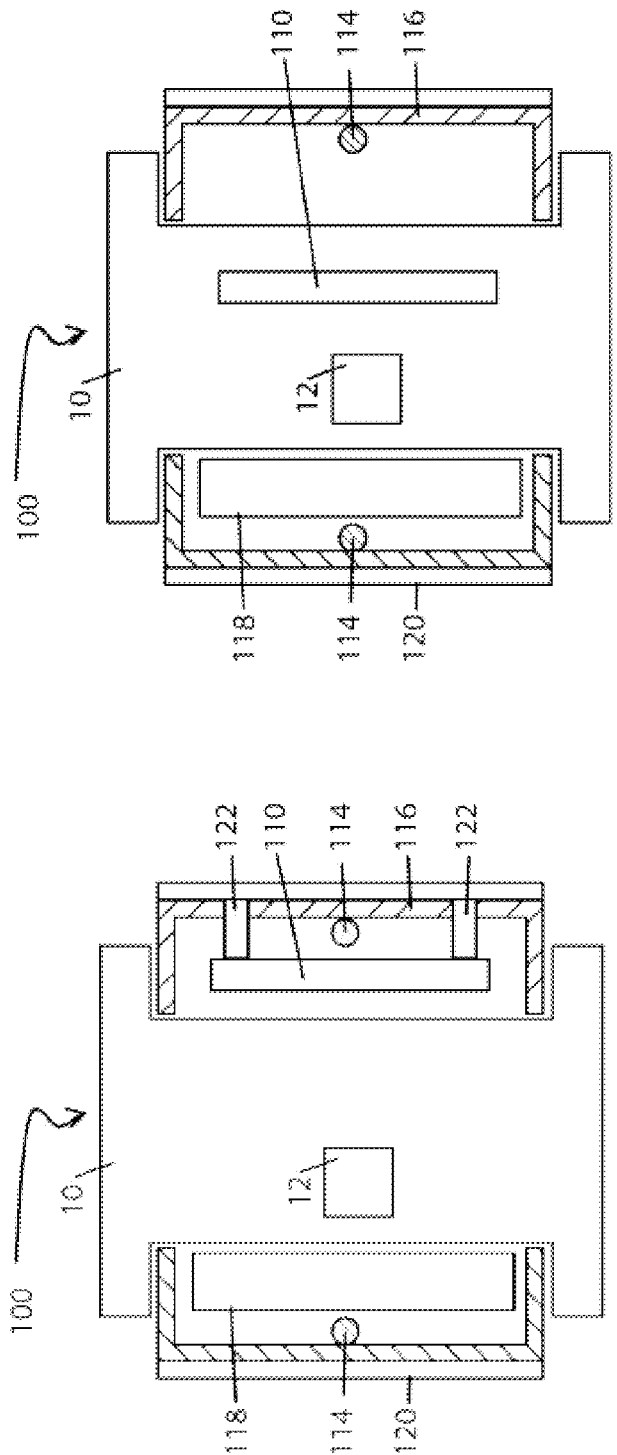
FIG. 1A is a cross-section illustration of an example of a wireless load cell assembly wherein an electronics system of the wireless load cell assembly is a printed circuit board mounted to a housing of the wireless load cell assembly according to aspects of the disclosure.
FIG. 1B is a cross-section illustration of an example of a wireless load cell assembly wherein the electronics system is embedded on a flexible circuit which is mounted to a load cell according to aspects of the disclosure.

FIGS. 1A and 1B are illustrations of two examples of a wireless load cell assembly 100. The wireless load cell assembly 100 can be used as part of an integrated wireless data system for measuring operational data of at least one component of a monitored system for at least one of safety and health monitoring and control. The wireless load cell assembly 100 includes a two-sided clamp-on housing 116 annularly disposed about an existing load cell 10, and can be made from plastic or thin walled metal, for example. The housing 116 can be freely rotatable and can be installed without regard to rotational orientation. Because the housing 116 does not require a specific rotational orientation, no anti-rotation coupler is required. The existing load cell 10 contains a plurality of strain gages 12 to measure load cell deflection and thereby provide a direct measurement of axial load.

The wireless load cell assembly 100 includes an electronics system 110 disposed in the housing 116. The electronics system 110 can be a printed circuit board made of hard substrate such as fiberglass, and mounted to the housing 116 with standoffs 122 (FIG. 1A). Alternatively, the electronics system 110 can be a flexible, thin dielectric film adhered to the load cell 10, eliminating the need for the standoffs 122 (FIG. 1B). The electronics system 110 can include at least one additional sensor 113 (FIG. 3), such as, but not limited to a velocimeter, accelerometer, gyroscope and temperature sensor. Thus, the wireless load cell assembly can be used for measuring the operational data (i.e., data from the plurality of strain gages 12 and from the at least one additional sensor 113) of the at least one component of the monitored system with an associated plurality of measurement parameters.

The wireless load cell assembly 100 includes at least one cell antenna 114 that may be wrapped around the housing 116, enabling transmission 360 degrees around the load cell 10, or it may be comprised of two cell antennae 114 mounted 180 degrees apart from each other, also enabling 360 degrees of transmission around the load cell 10.

The wireless load cell assembly 100 includes and is powered through a rechargeable energy storage device 118 such as a battery, a capacitor or other type of storage device. The wireless load cell assembly 100 can additionally include power management that enables extremely low power consumption, with a current draw of less than 0.5-0.6 mA at 60 Hz from the rechargeable energy storage device 118 and the wireless load cell assembly 100 can include one or more energy harvesting systems 120. The energy harvesting device 120 can, for example be a solar panel sleeve 120 wrapped around the housing 116 and used to recharge the rechargeable energy storage device 118.

Figure 2:
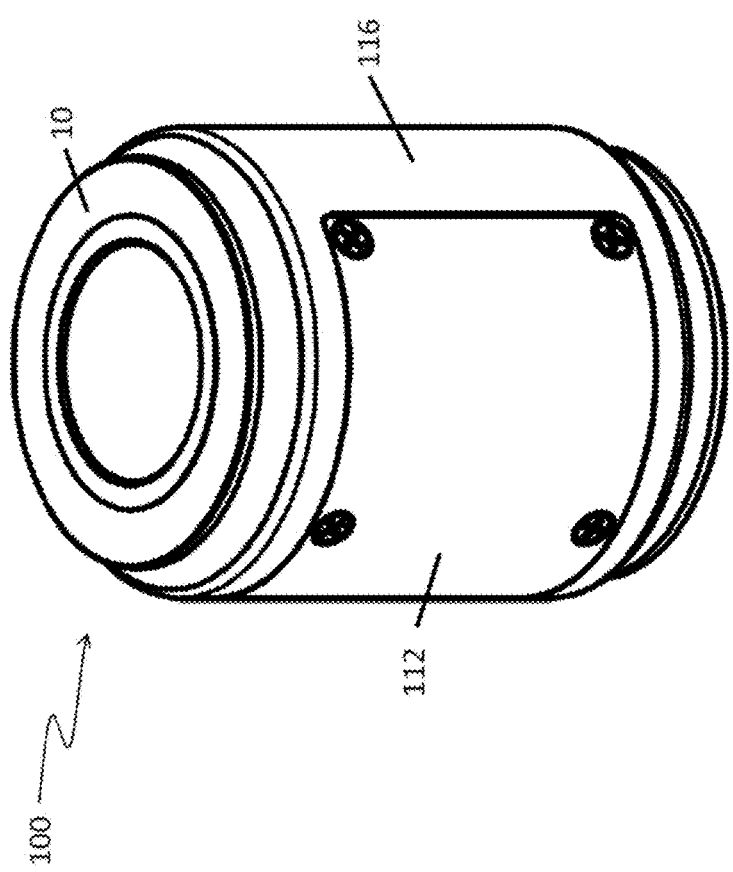
FIG. 2 is an isometric illustration of an example of a wireless load cell assembly with a clam-shell housing allowing access to the electronic system disposed in the housing according to aspects of the disclosure.

As best shown in FIG. 2, the housing 116 of the wireless load cell assembly 100 can define a clamshell opening 112 to allow access to the internal components of the wireless load cell assembly 100 (e.g., printed circuit board 110, rechargeable energy storage device 118, etc.).

Figure 3:
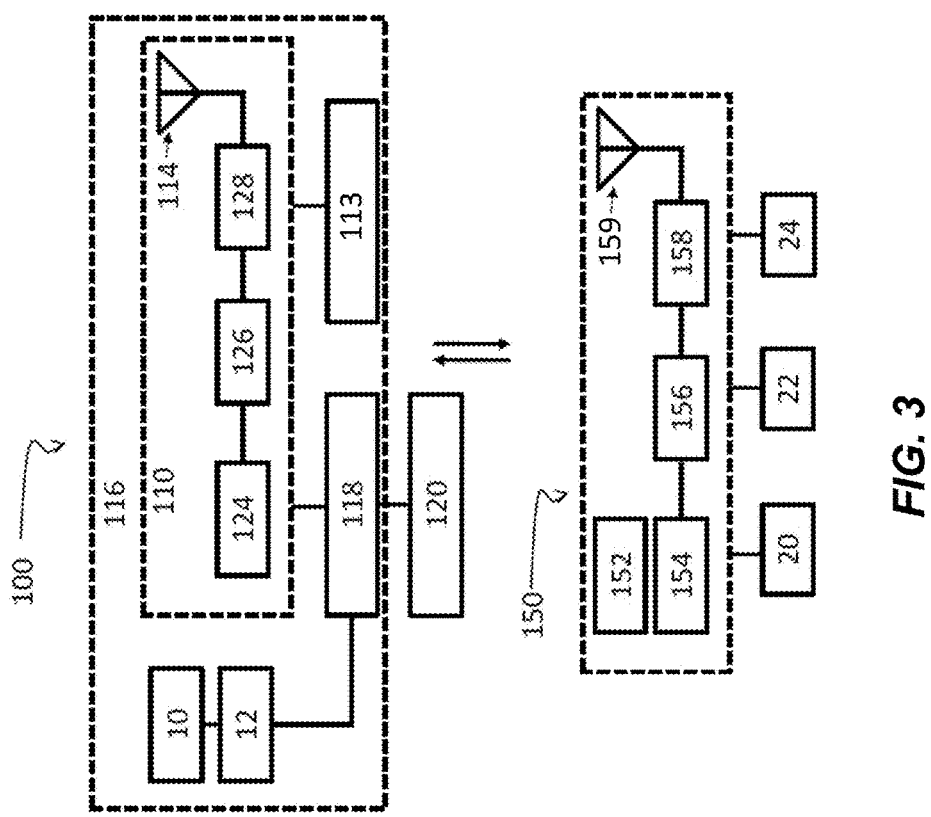
FIG. 3 is a block diagram of an example of an integrated wireless data system's architecture according to aspects of the disclosure.
Figure 4:
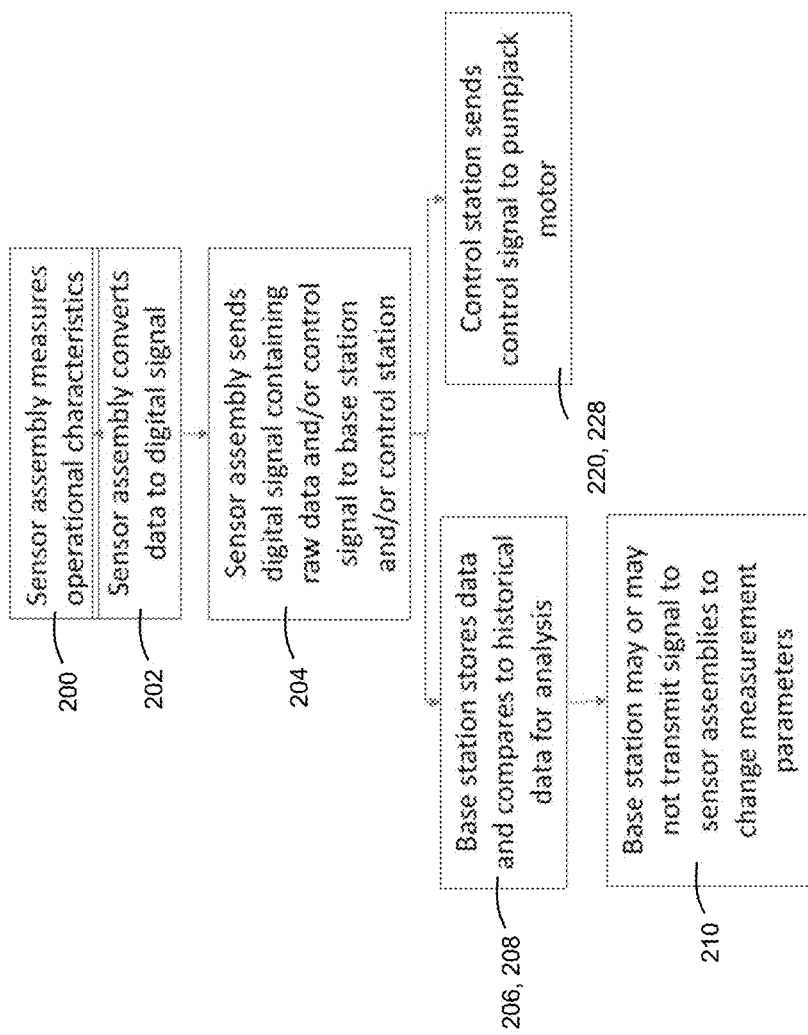
FIGS. 4 and 5A-5C illustrate flowcharts of the method for controlling and measuring operational data of a monitored system using an integrated wireless data system according to aspects of the disclosure.
Figure 5A:
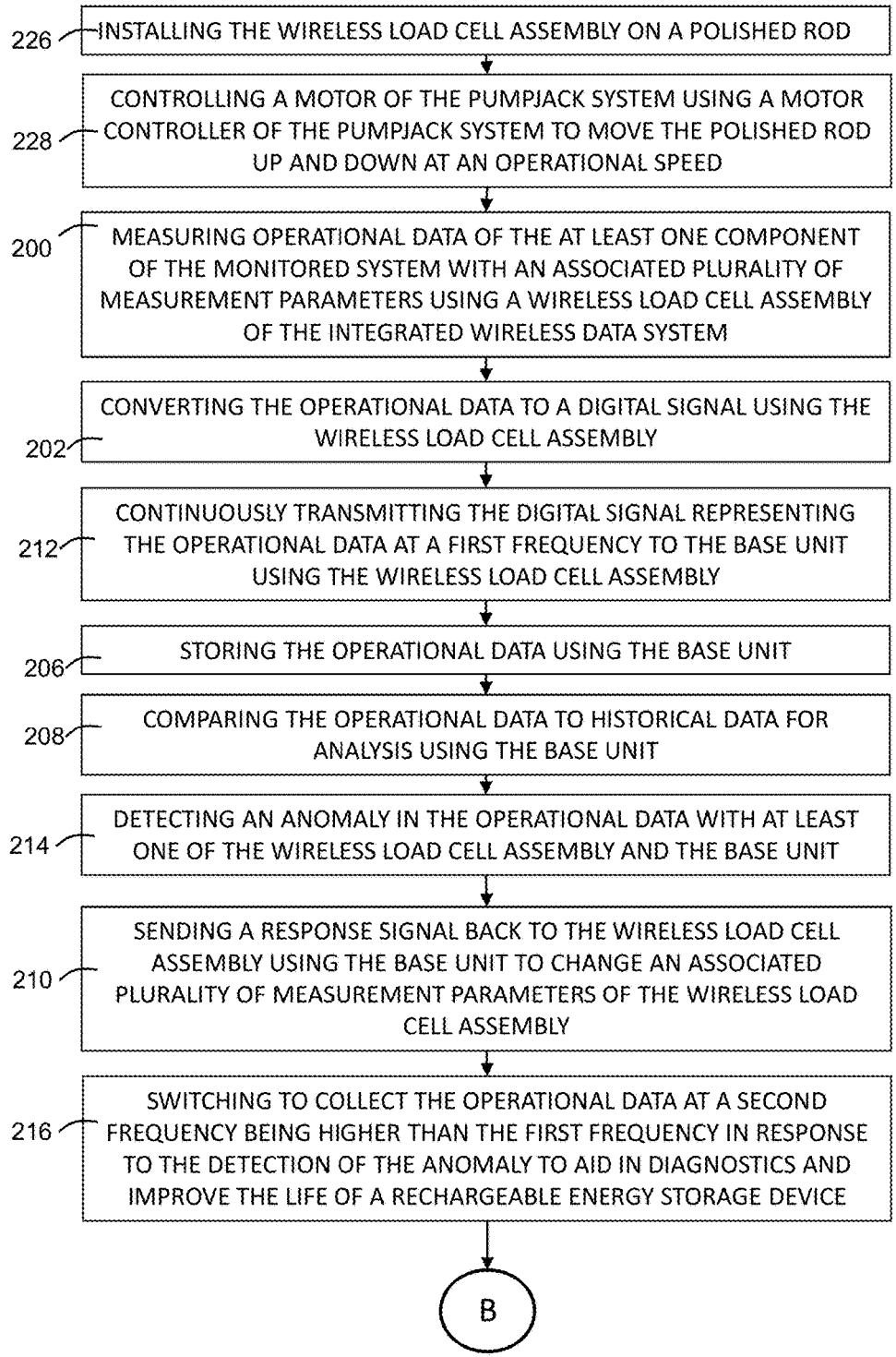
Figure 5B:
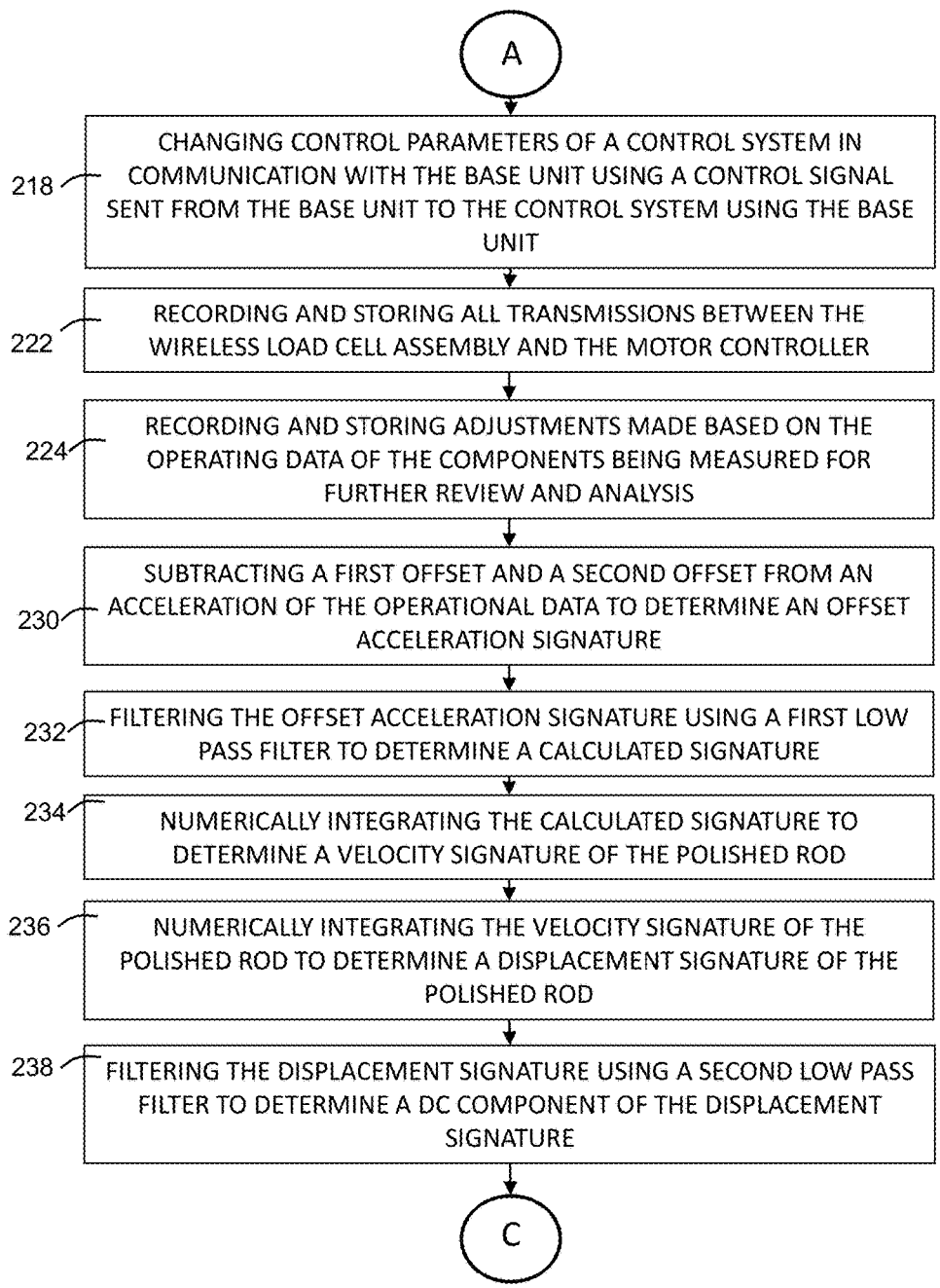
Figure 5C:
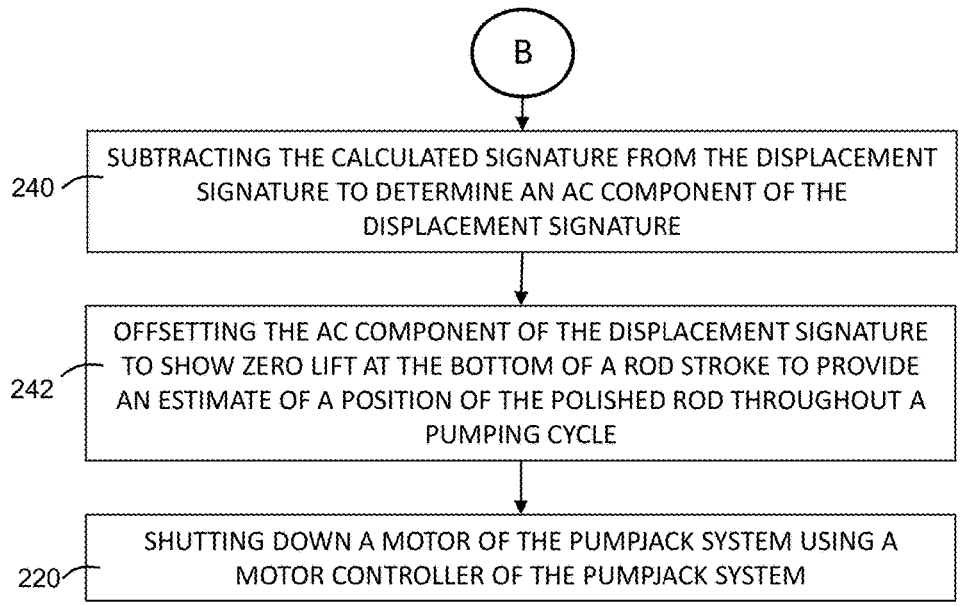

FIG. 3 is a block diagram of an example of an integrated wireless data system's architecture in accordance with an aspect of the present disclosure. As discussed above, the wireless load cell assembly 100 includes an energy harvesting system 120, which may or may not be contained in the housing 116. The wireless load cell assembly 100 contains the load cell 10 and also includes a plurality of strain gages 12, a rechargeable energy storage device 118, one or more cell antennae 114, and the electronics system 110 (e.g., printed circuit board) coupled to the rechargeable energy storage device 118. In more detail, the electronics system 110 contains a cell microprocessor 124 coupled to a cell analog to digital (A/D) converter 126 and to a cell transceiver 128. The cell microprocessor 124 is configured to process and output the operational data and a control signal for controlling the monitored system using the cell transceiver 128 and the at least one cell antenna 114. The cell transceiver 128 is wired or electrically coupled to the one or more antennae 114. One side of the housing 116 can contain the rechargeable energy storage device 118 and the other side can contain the electronics system 110 with one or more sensors (e.g., the plurality of strain gages 12 and from the at least one additional sensor 113), the cell transceiver 128, and one or more antennae 114. The use of the on-board cell microprocessor 124 in the wireless load cell assembly 100 enables transmission of the control signal that has been processed based on all sensor inputs or operational data. This further reduces power consumption due to a reduction in the amount of data that needs to be transmitted.

The wireless load cell assembly 100 is in wireless communications with a base unit 150 disposed remotely from and in communication with the wireless load cell assembly 100 for receiving and analyzing the operational data. The base unit 150 is also configured to send a response signal back to the wireless load cell assembly 100 to change the associated plurality of measurement parameters of the wireless load cell assembly 100 based on the operational data received. The base unit 150 includes a base microprocessor 154 coupled to base analog to digital (A/D) converter 156 and to a base transceiver 158. The base unit 150 additionally includes at least one base antenna 159 electrically coupled to the base transceiver 158. The base unit 150 is powered from an external power source 20, and may or may not be connected to a control system 22. The base unit 150 stores the operational data to memory 152 and/or to a control system 22 and/or to a data acquisition system 24. So, the base microprocessor 154 of the base unit 150 is configured to process and store the operational data in the memory 152.

FIGS. 4 and 5A-5C are flowcharts of the method for measuring and controlling operational data of one or more components using the integrated wireless data system utilizing the wireless load cell assembly 100. The wireless load assembly 100 measures the operational characteristics of a system or component, converts the data to a digital signal and transmits the signal wirelessly to the base unit 150. Thus, the method includes the step of 200 measuring operational data of the at least one component of the monitored system with an associated plurality of measurement parameters using a wireless load cell assembly 100 of the integrated wireless data system. Next, the method includes the steps of 202 converting the operational data to a digital signal using the wireless load cell assembly 100 (e.g., using the cell analog to digital converter 126) and 204 transmitting the digital signal representing the operational data to a base unit 150 using the wireless load cell assembly 100 (e.g., using the base transceiver 128 at least one base antenna 114). The base unit 150 can then store the operational data (e.g., in memory 152) and compare it to historical data for analysis. So, the method proceeds by 206 storing the operational data using the base unit 150 and 208 comparing the operational data to historical data for analysis using the base unit 150. The results of this analysis can then be used to send a signal back to the wireless load cell assembly 100 to change measurement parameters, such as, but not limited to, the data rate. Therefore, the method can include the step of 210 sending a response signal back to the wireless load cell assembly using the base unit 150 to change an associated plurality of measurement parameters of the wireless load cell assembly 100.

For example, the wireless load cell assembly 100 can continuously transmit operational data at lower frequencies, and then switch to collect higher frequency data when an anomaly occurs, this ability aids in diagnostics and improves the life of the rechargeable energy storage device 118. Thus, the step of 204 transmitting the digital signal representing the operational data to the base unit 150 using the wireless load cell assembly 100 can include the step of 212 continuously transmitting the digital signal representing the operational data at a first frequency to the base unit 150 using the wireless load cell assembly 100. Next, 214 detecting an anomaly in the operational data with at least one of the wireless load cell assembly 100 and the base unit 150 and 216 switching to collect the operational data at a second frequency being higher than the first frequency in response to the detection of the anomaly to aid in diagnostics and improve the life of a rechargeable energy storage device 118.

When used in conjunction with a control system 22, the base unit 150 can also be used to change control parameters of the control system 22. So, the method can include the step of 218 changing control parameters of a control system 22 in communication with the base unit 150 using a control signal sent from the base unit 150 to the control system 22 using the base unit 150. For example, in the case of a pumpjack motor, the control signal might be used to shut down the motor (discussed in more detail below). Thus, the step of 218 changing control parameters of the control system 22 in communication with the base unit 150 using the control signal sent from the base unit 150 to the control system 22 using the base unit 150 may include the step of 220 shutting down a motor of the pumpjack system using a motor controller of the pumpjack system 300. The base unit 150 may record and store all data (e.g., in a database) obtained by the wireless load cell assembly 100, all transmissions between the wireless load cell assembly 100 and motor controllers, and any adjustments made based on the operating characteristics of the components being measured for further review and analysis. So, the method can proceed with the steps of 222 recording and storing all transmissions between the wireless load cell assembly 100 and the motor controller and 224 recording and storing adjustments made based on the operating data of the components being measured for further review and analysis.

As an example of the benefits of the disclosed invention over prior art, FIG. 6 shows a schematic of the integrated wireless data system as installed on a pumpjack system 300. The wireless load cell assembly 100 is installed on the polished rod 310, which moves up and down during operation at a speed set by the motor 340, which is controlled by the motor controller 350. So, the method can include the steps of 226 installing the wireless load cell assembly 100 on a polished rod 310 and 228 controlling a motor 340 of the pumpjack system 300 using a motor controller 350 of the pumpjack system 300 to move the polished rod 310 up and down at an operational speed. The wireless load cell assembly 100 transmits operational characteristics of the rod load, location and speed back to the base unit 150, which is in communication with the motor controller 350.

Figure 7A:
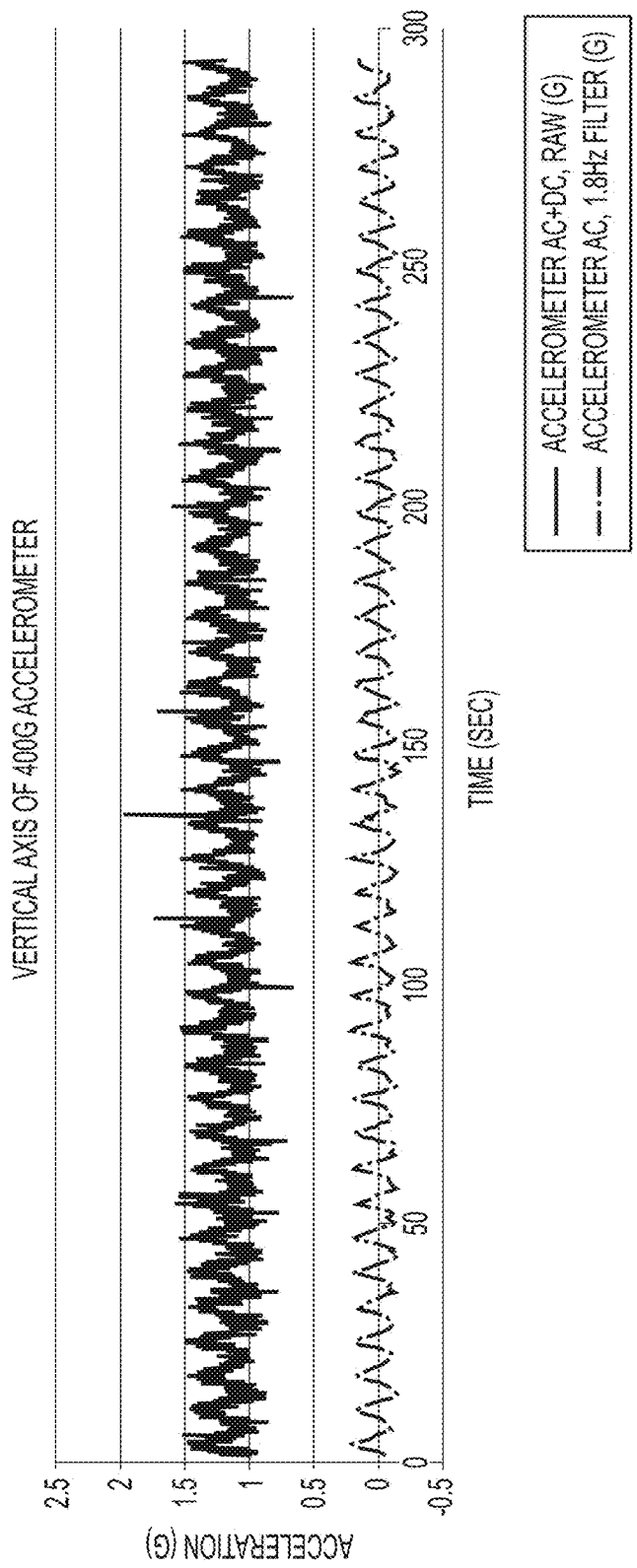
FIG. 7A and FIG. 7B are graphical illustrations of measurements taken from a polished rod of a pumpjack system via the wireless load cell assembly according to aspects of the disclosure.
Figure 7B:
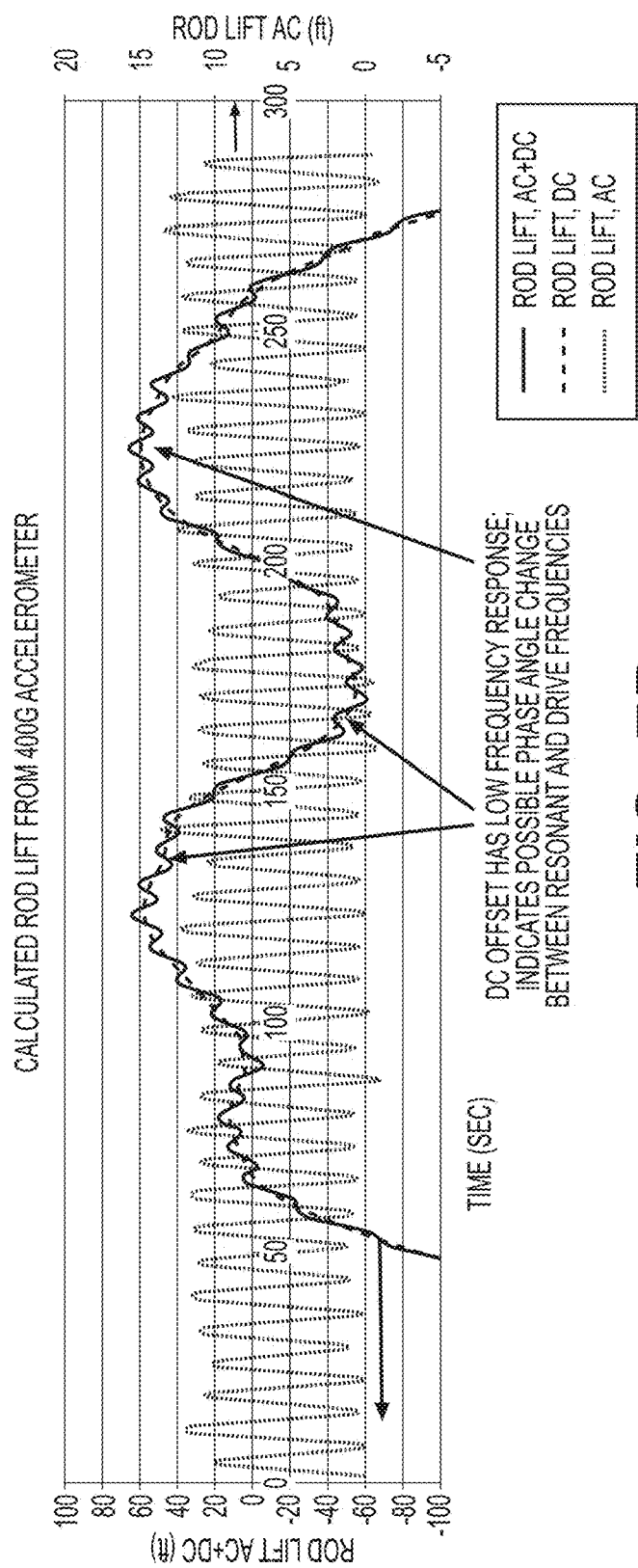

FIGS. 7A and 7B are graphical illustrations of measurements taken from a polished rod 310 of a pumpjack system 300 via a wireless load cell assembly 100 in accordance with an aspect of the present disclosure. FIG. 7A illustrates the measured vertical acceleration of the polished rod 310 using the wireless load cell assembly 100 during multiple pumping cycles. The raw data exhibits a 1 g offset due to the gravitational field on the vertical axis, and an additional 0.2 g offset due to a zeroing error in the +/−400 g accelerometer when used in the +/−100 g range. FIG. 7A also demonstrates the vertical acceleration when the offsets are subtracted and the data are digitally filtered with a 1.8 Hz low-pass filter. FIG. 7B shows a calculated rod lift using the filtered, AC vertical accelerometer data. Therefore, the method can include the steps of 230 subtracting a first offset (e.g., 1 g) and a second offset (e.g., 0.2 g) from an acceleration of the operational data (e.g., from the accelerometer) to determine an offset acceleration signature and 232 filtering the offset acceleration signature using a first low pass filter to determine a calculated signature. Rod lift is calculated by numerically integrating acceleration to determine velocity, then numerically integrating velocity to determine displacement. The DC component of the displacement signature was calculated using a digital low pass filter and then subtracted off of the originally calculated signature to determine an AC displacement signature. This signature was then offset to show a zero lift at the bottom of the rod stroke. So, the method can also include the steps of 234 numerically integrating the calculated signature to determine a velocity signature of the polished rod 310 and 236 numerically integrating the velocity signature of the polished rod 310 to determine a displacement signature of the polished rod 310. The method can also include the step of 238 filtering the displacement signature using a second low pass filter to determine a DC component of the displacement signature. Next, 240 subtracting the calculated signature from the displacement signature to determine an AC component of the displacement signature. The method can also include 242 offsetting the AC component of the displacement signature to show zero lift at the bottom of a rod stroke to provide an estimate of a position of the polished rod 310 throughout a pumping cycle. While some cycle-to-cycle variability can be observed, the data provide a reasonable estimate of the position of the polished rod 310 throughout the pumping cycle.

Embodiments disclosed herein can be implemented in digital electronic circuitry, or in computer software, firmware, or hardware, including the herein disclosed structures and their equivalents. Some embodiments can be implemented as one or more computer programs, i.e., one or more modules of computer program instructions, encoded on a tangible computer storage medium for execution by one or more processors (e.g., cell microprocessor 124 or base microprocessor 154). A computer storage medium (e.g., memory 152) can be, or can be included in, a computer-readable storage device, a computer-readable storage substrate, or a random or serial access memory. The computer storage medium can also be, or can be included in, one or more separate tangible components or media such as multiple CDs, disks, or other storage devices. The computer storage medium does not include a transitory signal.

As used herein, the term processor or controller encompasses all kinds of apparatus, devices, and machines for processing data, including by way of example a programmable processor, a computer, a system on a chip, or multiple ones, or combinations, of the foregoing. The processor can include special purpose logic circuitry, e.g., an FPGA or an ASIC (application-specific integrated circuit). The processor or controller also can include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, module, engine, software, software application, application, script, or code) can be written in any form of programming language, including compiled or interpreted languages, declarative or procedural languages, and the program can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated degrees or at other orientations) and the spatially relative descriptions used herein interpreted accordingly.

What is claimed is:

1. An integrated wireless data system for measuring operational data of at least one component of a monitored system for at least one of safety and health monitoring and control, comprising:

a wireless load cell assembly including a housing disposed about and containing a load cell and a plurality of strain gages and at least one additional sensor for measuring the operational data of the at least one component of the monitored system with an associated plurality of measurement parameters;

said wireless load cell assembly having an electronics system including a cell analog to digital converter and a cell transceiver for wireless communication;

said wireless load cell assembly including at least one cell antenna electrically coupled to said cell transceiver;

said electronics system including a cell microprocessor electrically coupled to said cell analog to digital converter and said cell transceiver and said plurality of strain gages and said at least one additional sensor and configured to process and output the operational data and a control signal for controlling the monitored system using said cell transceiver and said at least one cell antenna; and a base unit disposed remotely from and in communication with said wireless load cell assembly for receiving and analyzing the operational data and sending a response signal back to the wireless load cell assembly to change the associated plurality of measurement parameters of the wireless load cell assembly based on the operational data received.

2. The integrated wireless data system as set forth in claim 1, wherein the operational data is output from said wireless load cell assembly at a first frequency and said base unit is configured to detect an anomaly in the operational data and the cell microprocessor is further configured to switch to collect the operational data at a second frequency being higher than the first frequency in response to the detection of the anomaly.

3. The integrated wireless data system as set forth in claim 1, wherein said base unit includes a base analog to digital converter and a base transceiver and at least one base antenna electrically coupled to said base transceiver and a memory and a base microprocessor electrically coupled to said base analog to digital converter and said base transceiver and said memory and configured to process and store the operational data in said memory.

4. The integrated wireless data system as set forth in claim 1, wherein said electronics system is a printed circuit board of a hard substrate mounted to said housing with a plurality of standoffs.

5. The integrated wireless data system as set forth in claim 1, wherein said electronics system is a printed circuit board of a flexible thin dielectric film adhered to said load cell.

6. The integrated wireless data system as set forth in claim 1, wherein said at least one cell antenna is wrapped around said housing enabling transmission 360 degrees around said load cell.

7. The integrated wireless data system as set forth in claim 1, wherein said at least one cell antenna includes two antennae mounted 180 degrees apart from each other enabling transmission 360 degrees around said load cell.

8. The integrated wireless data system as set forth in claim 1, wherein said wireless load cell assembly includes an energy harvesting system.

9. The integrated wireless data system as set forth in claim 1, wherein said wireless load cell assembly including a rechargeable energy storage device for providing power to said wireless load cell assembly.

10. The integrated wireless data system as set forth in claim 1, wherein said at least one additional sensor includes at least one of a velocimeter and an accelerometer and a gyroscope and a temperature sensor.

11. The integrated wireless data system as set forth in claim 1, wherein said cell microprocessor is further configured to include power management enabling a current draw of less than 1.5 milliamps at 60 Hz.

12. The integrated wireless data system as set forth in claim 1, wherein said housing of said wireless load cell assembly defines a clamshell opening to allow access to said electronics system and said load cell and said plurality of strain gages and said at least one additional sensor.

13. A method of operating an integrated wireless data system for measuring operational data of at least one component of a monitored system for safety, health monitoring, and control comprising the steps of:
measuring operational data of the at least one component of the monitored system with an associated plurality of measurement parameters using a wireless load cell assembly of the integrated wireless data system;
converting the operational data to a digital signal using the wireless load cell assembly;
transmitting the digital signal representing the operational data to a base unit using the wireless load cell assembly;
storing the operational data using the base unit;
comparing the operational data to historical data for analysis using the base unit; and
sending a response signal back to the wireless load cell assembly using the base unit to change an associated plurality of measurement parameters of the wireless load cell assembly.

14. The method as set forth in claim 13, wherein the step of transmitting the digital signal representing the operational data to a base unit using the wireless load cell assembly includes the steps of:
continuously transmitting the digital signal representing the operational data at a first frequency to the base unit using the wireless load cell assembly;
detecting an anomaly in the operational data with at least one of the wireless load cell assembly and the base unit; and
switching to collect the operational data at a second frequency being higher than the first frequency in response to the detection of the anomaly to aid in diagnostics and improve the life of a rechargeable energy storage device.

15. The method as set forth in claim 13, further including the step of changing control parameters of a control system in communication with the base unit using a control signal sent from the base unit to the control system using the base unit.

16. The method as set forth in claim 15, wherein the monitored system is a pumpjack system and the step of changing control parameters of a control system in communication with the base unit using a control signal sent from the base unit to the control system using the base unit includes the step of shutting down a motor of the pumpjack system using a motor controller of the pumpjack system.

17. The method as set forth in claim 16, further including the steps of:
recording and storing all transmissions between the wireless load cell assembly and the motor controller; and
recording and storing adjustments made based on the operating data of the components being measured for further review and analysis.

18. The method as set forth in claim 13, wherein the monitored system is a pumpjack system and the method further includes the steps of:
installing the wireless load cell assembly on a polished rod; and
controlling a motor of the pumpjack system using a motor controller of the pumpjack system to move the polished rod up and down at an operational speed.

19. The method as set forth in claim 18, further including the steps of:
subtracting a first offset and a second offset from an acceleration of the operational data to determine an offset acceleration signature;
filtering the offset acceleration signature using a first low pass filter to determine a calculated signature;
numerically integrating the calculated signature to determine a velocity signature of the polished rod; and
numerically integrating the velocity signature of the polished rod to determine a displacement signature of the polished rod.

20. The method as set forth in claim 19, further including the steps of:
filtering the displacement signature using a second low pass filter to determine a DC component of the displacement signature;
subtracting the calculated signature from the displacement signature to determine an AC component of the displacement signature; and
offsetting the AC component of the displacement signature to show zero lift at the bottom of a rod stroke to provide an estimate of a position of the polished rod throughout a pumping cycle.

* * * * *